(12) United States Patent
Ito et al.

(10) Patent No.: US 7,119,442 B2
(45) Date of Patent: Oct. 10, 2006

(54) SEMICONDUCTOR DEVICE

(75) Inventors: Sachiyo Ito, Yokohama (JP); Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/986,071

(22) Filed: Nov. 12, 2004

(65) Prior Publication Data

US 2005/0200021 A1    Sep. 15, 2005

(30) Foreign Application Priority Data

Mar. 11, 2004   (JP)   ............... 2004-068914

(51) Int. Cl.
 H01L 23/48   (2006.01)
 H01L 23/52   (2006.01)
 H01L 29/40   (2006.01)
 H01L 27/10   (2006.01)
 H01L 29/74   (2006.01)

(52) U.S. Cl. ............... 257/758; 257/211; 257/760; 257/E21.577; 257/E21.578; 257/E21.579

(58) Field of Classification Search ............ 257/758, 257/E21.577–9
 See application file for complete search history.

(56) References Cited

U.S. PATENT DOCUMENTS 6,713,873 B1 *  3/2004  O'Loughlin et al. ......... 257/758

2003/0116854 A1   6/2003  Ito et al.
2005/0116348 A1 *  6/2005  Minamihaba et al. ....... 257/758

FOREIGN PATENT DOCUMENTS

JP   11-054621   2/1999
JP   2003-197742   7/2003
JP   2003-289099   10/2003

* cited by examiner

Primary Examiner—Kenneth Parker
Assistant Examiner—Jesse A. Fenty

(57) ABSTRACT

A semiconductor device comprising a first insulating layer formed above a semiconductor substrate, and comprising a first insulating material, a second insulating material and a hole, a relative dielectric constant of the first insulating material being 3 or less, a Young's modulus of the first insulating material being 10 GPa or less, a linear expansivity of the first insulating material being greater than $30 \times 10^{-6 \circ}$ C.$^{-1}$, and a linear expansivity of the second insulating material being $30 \times 10^{-6 \circ}$ C.$^{-1}$ or less, and a second insulating layer formed on the first insulating layer, the second insulating layer having a groove connected to the hole, wherein a linear expansivity $\alpha$ of the first insulating layer within 6 μm from the hole is $30 \times 10^{-6 \circ}$ C.$^{-1}$ or less, where $$\alpha = \sum_{i=1}^{} v_i \alpha_i,$$

$v_i$ and $\alpha_i$ are a volume ratio and a linear expansivity of an i-th insulating material.

30 Claims, 4 Drawing Sheets

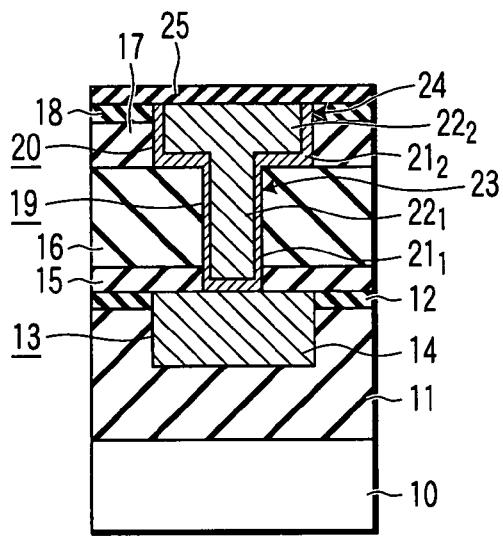
F I G. 1
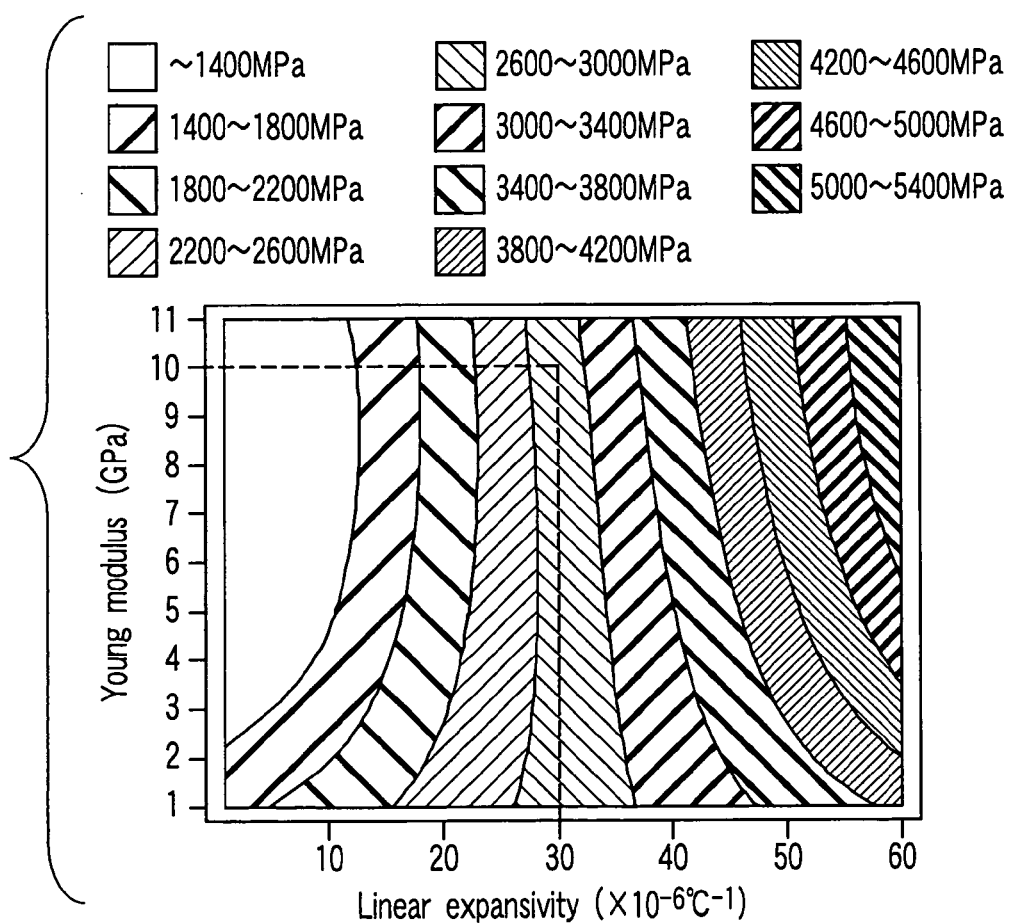
F I G. 2

SEMICONDUCTOR DEVICE

CROSS-REFERENCE TO RELATED APPLICATIONS

This application is based upon and claims the benefit of priority from prior Japanese Patent Application No. 2004-068914, filed Mar. 11, 2004, the entire contents of which are incorporated herein by reference.

BACKGROUND OF THE INVENTION

1. Field of the Invention

The present invention relates to a semiconductor device having a via plug formed from Cu.

2. Description of the Related Art

In order to accelerate an LSI operation, an insulating film with a low dielectric constant is used as an interlayer insulating film. This insulating film is formed by lowering a density of a material for the film or eliminating polarity in the material. For example, a porous material is generally produced in order to lower a material density. As a result of lowering a film density in order to lower a relative dielectric constant, there is a tendency that the Young's modulus decreases with a decrease in relative dielectric constant, thus the linear expansivity increases. In particular, in recent years, in a low dielectric insulating film with a relative dielectric constant of 3.0 or less used to reduce a low dielectric constant, in general, the Young's modulus has been as low as 10 GPa or less, and the linear expansivity has been greater than $30 \times 10^{-6\circ}$ $C.^{-1}$.

In a high temperature process such as annealing or sintering, with an electrically conductive material such as a barrier metal or an interlayer insulating film, a thermal stress is generated due to a linear expansivity difference from materials which form interfaces, respectively. A linear expansivity of Cu which is a wiring material is as great as about 16 to $30 \times 10^{-6\circ}$ $C.^{-1}$ in the temperature range from room temperature to 500° C. However, a barrier metal layer used between Cu and an interlayer insulating film includes a high melting point metal such as Ta or Ti or its component, with a linear expansivity is $10 \times 10^{-6\circ}$ $C.^{-1}$ or less.

Therefore, in the case where a low dielectric constant insulating film has been used as an interlayer insulating film, a high concentration of a great tensile stress occurs with a barrier metal layer which is smaller than both of Cu and the insulating film with a low dielectric constant in linear expansivity. Since it is sandwiched between Cu having a comparatively high linear expansivity and the insulating film with a low dielectric constant. A thermal stress generated with this barrier metal increases with an increase in linear expansivity of a low dielectric constant insulating film disposed in the periphery of an electrically conducting layer such as a wire or a via plug. In particular, in the case where the linear expansivity of the insulating film with a low dielectric constant is greater than that of Cu ($30 \times 10^{-6\circ}$ $C.^{-1}$), a thermal stress applied to the barrier metal layer rapidly increases.

At a side wall portion of the via plug, film thickness of the barrier metal is thinner than that of another portion. Thus, there is a possibility that a crack occurs because of a thermal stress which affects a barrier metal layer. In general, a low dielectric constant insulating film has a low breakage strength, and the crack generated with the barrier metal layer may be advanced up to the inside of the low dielectric constant insulating film. As a result, with respect to an electrically conductive material such as Cu which is in a compression stress state at a high temperature, a short-circuit failure may occur due to the breakage caused by a crack (Jpn. Pat. Appln. KOKAI Publication No. 2003-197742).

BRIEF SUMMARY OF THE INVENTION

According to an aspect of the present invention, there is provided a semiconductor device comprising: a semiconductor substrate; a first insulating layer formed above the semiconductor substrate, and having a first hole, the first insulating layer being configured of a plurality of insulating materials which include a first insulating material having a relative dielectric constant of 3 or less, a Young's modulus of 3 or less, and a linear expansivity of greater than $30 \times 10^{-6\circ}$ $C.^{-1}$, and a second insulating material having a linear expansivity of $30 \times 10^{-6\circ}$ $C.^{-1}$ or less; a second insulating layer formed on the first insulating layer, and having a groove connected to the first hole; a barrier metal layer formed on a surface of the first hole and groove; and an electrically conducting layer comprising Cu formed on the barrier metal layer, wherein a composite linear expansivity α is expressed by the following formula:

$$\alpha = \sum_{i=1} v_i \alpha_i$$

where $v_i$ is a volume ratio of an i-th insulating material, and $\alpha_i$ is a linear expansivity of the i-th insulating material, and the composite linear expansivity α of the first insulating layer within 6 μm from the first hole is $30 \times 10^{-6\circ}$ $C.^{-1}$ or less.

BRIEF DESCRIPTION OF THE SEVERAL VIEWS OF THE DRAWING

FIG. 1 is a view showing a construction of a semiconductor device according to a first embodiment;

FIG. 2 is a view showing dependency on a Young's modulus and a linear expansivity of a thermal stress generated with a barrier metal layer;

DETAILED DESCRIPTION OF THE INVENTION

Figure 3A:
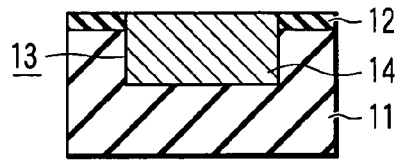
FIGS. 3A to 3E are sectional view each showing a process for manufacturing the semiconductor device shown in FIG. 1.

Hereinafter, embodiments of the present invention will be described with reference to the accompanying drawings.

First Embodiment

FIG. 1 is a sectional view showing a semiconductor device according to a first embodiment of the present invention.

As shown in FIG. 1, a low dielectric constant interlayer insulating film 11 and a first cap insulating film 12 with a high breakage strength are laminated on a semiconductor substrate 10. A lower layer wiring grooves 13 are formed in the low dielectric constant insulating film 11 and the first cap insulating film 12. A lower layer wire 14 is formed via a barrier metal layer (not shown) in the lower layer wiring groove 13. An etching stopper insulating film (third insulating layer) 15, a low linear expansivity insulating layer (first insulating layer) 16, a low dielectric constant insulating film (second insulating layer) 17, and a second cap insulating layer 18 are formed on the first cap insulating film 12 and the lower layer wire 14.

The etching stopper insulating film 15 is, for example, a silicon nitride film (relative dielectric constant=7.0 and Young's modulus=100 GPa) formed by plasma CVD method. In addition, as the low dielectric constant insulating film 17, for example, there can be used a polymethyl siloxane film (relative dielectric constant=2.8, Young's modulus=5 GPa, and linear expansivity=$40 \times 10^{-6}$ $C.^{-1}$) formed by an ordinary heat treatment process. In addition, the low dielectric constant insulating film 17 may be formed by using an organic insulating film; a hydrogen silsesquioxane or carbon-containing $SiO_2$ film (SiOC); a porous silica film; a polymeric film; or an F-doped amorphous carbon film. Any of these materials are equal to or smaller than 10 GPa in Young's modulus and are greater than $30 \times 10^{-6}$ $C.^{-1}$ in linear expansivity. The second cap insulating film 18 is, for example, a silicon oxide film formed by plasma CVD method.

A via hole (first hole) 19 is formed on the etching stopper insulating film 15 and low linear expansivity insulating film 16. An upper layer wiring groove 20 is formed on the low dielectric constant insulating film 17 and the second cap insulating film 18. A barrier metal layer $21_1$, $21_2$ are formed on the via hole 19 and a surface of the upper layer wiring groove 20. The barrier metal layer $21_1$, $21_2$ can be composed of Ta, Ti, W, Nb and an alloy containing these elements, a compound thereof, or a laminated film thereof. Electrically conductive materials $22_1$, $22_2$, each of which comprises Cu, are formed on the surface of the barrier metal layer $21_1$, $21_2$. The barrier metal layer $21_1$ and electrically conductive material $22_1$ embedded in the via hole 19 are via plugs 23. In addition, the barrier metal layer $21_2$ and electrically conductive material $22_2$ embedded in the upper layer wiring groove 20 are upper layer wires 24.

In the present embodiment, as the low linear expansivity insulating layer 16, for example, there is used a film obtained by dispersing particles of an organic silicon oxide (relative dielectric constant=3.0, Young's modulus=15 GPa, and linear expansivity=$10 \times 10^{-6}$ $C.^{-1}$) having a comparatively low linear expansivity on polymethyl siloxane (relative dielectric constant=2.8, Young's modulus=5 GPa, and linear expansivity=$40 \times 10^{-6}$ $C.^{-1}$). Instead of polymethyl siloxane, an organic insulating material, hydrogen silsesquioxane, carbon-containing $SiO_2$ (SiOC), porous silica, polymeric material, or (F-doped) amorphous carbon may be used. Any of these materials is 3 or less in relative dielectric constant; is 10 Gpa or less in Young modulus; and is greater than $30 \times 10^{-6}$ $C.^{-1}$ in linear expansivity. As a material for insulating material particles having a comparatively lower linear expansivity, there may be used carbon-containing $SiO_2$ (SiOC), or fluorine containing $SiO_2$ (SiOF). Any of these materials is 10 GPa to 40 GPa in Young's modulus and about $0.1 \times 10^{-6}$ $C.^{-1}$ to $10 \times 10^{-6}$ $C.^{-1}$ in linear expansivity.

Particles of an organic silicon oxide to be dispersed are about 1 nm to 5 nm in diameter, and the content is about 20 to 30 volume % with respect to polymethyl siloxane.

The low linear expansivity insulating layer 16 is composed of a plurality of insulating materials (polymethyl siloxane and organic silicon oxide). A composite linear expansivity $\alpha$ in the case where the insulating layer is composed of a plurality of materials can be obtained by the following formula.

$$\alpha = \sum_{i=1} v_i \alpha_i$$

where $V_i$ is a volume ratio of an i-th insulating material, and $\alpha_i$ is a linear expansivity of the i-th insulating material. The volume ratio is obtained as a volume ratio of at least two types of insulating materials disposed between an upper face of the etching stopper insulating film 15 and a lower face of the upper layer wire 24.

In the present embodiment, the content of particles of the organic silicon oxide is adjusted such that the composite linear expansivity $\alpha$ of the low linear expansivity insulating layer 16 is $30 \times 10^{-6}$ $C.^{-1}$ or less. There is a need for increasing the content of particles to some extent in order to maintain the composite linear expansivity $\alpha$ of the low linear expansivity insulating layer 16 at $30 \times 10^{-6}$ $C.^{-1}$ or less. However, if the constant is increased, a relative dielectric constant is also increased concurrently. Thus, in the present embodiment, 30 volume % has been defined as an upper limit.

FIG. 2 shows a result when a maximum value of a thermal stress generated with the barrier metal layer of the via hole portion has been obtained by means of simulation during annealing. Specifically, this figure shows a computation result when the Young's modulus of the insulating film is changed from 1 to 11 GPa, and when the linear expansivity is changed from $1 \times 10^{-6}$ $C.^{-1}$ to $60 \times 10^{-6}$ $C.^{-1}$. The linear expansivity dependency is greater than the Young's modulus dependency. As the linear expansivity increases, the thermal stress generated with the barrier metal layer increases. In particular, in a region in which the linear expansivity of the insulating film is greater than the linear expansivity ($30 \times 10^{-6}$ $C.^{-1}$) of Cu, the thermal stress generated with the barrier metal layer rapidly increases dependent on the linear expansivity of the insulating film. In addition, the Young's modulus dependency of the insulating film of the thermal stress generated with the barrier metal changes when the linear expansivity of the insulating film is on the borderline of $30 \times 10^{-6}$ $C.^{-1}$. Namely, in a region in which the linear expansivity of the insulating film is $30 \times 10^{-6}$ $C.^{-1}$ or less, as the Young's modulus of the insulating film increases, the thermal stress generated with the barrier metal layer decreases. In contrast, in a region in which the linear expansivity of the insulating film is $30 \times 10^{-6}$ $C.^{-1}$ or more, as the Young's modulus of the insulating film increases, the thermal stress generated with the barrier metal layer also increases.

A failure in multi-layered wire using a low dielectric constant insulating film with its low mechanical strength includes: an insulating layer crack caused by an external stress for CMP, probing and bonding other than those caused by the above-described thermal stress. In order to restrict this crack, it is desirable that the Young's modulus of the insulating film be high. Thus, in recent years, there has been a tendency that an attempt is made to ensure that the relative dielectric constant is made as low as possible, and the Young's modulus made as high as possible. However, as described previously, a value of thermal stress strongly depends on the linear expansivity of the low dielectric constant insulating film. In a low dielectric constant insulating film having its linear expansivity which is greater than $30 \times 10^{-6 \circ} C.^{-1}$ of a conventional insulating film, if an attempt is made to increase the Young's modulus in order to restrict a failure caused by an external stress, a thermal stress further increases, and an insulating film crack caused by such a thermal stress is prone to occur.

In the present embodiment, the low linear expansivity insulating film 16 is composed of a plurality of insulating materials, and the linear expansivity of the low linear expansivity insulating layer 16 is set to $30 \times 10^{-6 \circ} C.^{-1}$ or less, thereby making it possible to restrict an insulating film crack caused by an external stress, and at the same time, to restrict a crack from occurring with the low expansion insulating layer 16 due to a thermal stress. As a result, an occurrence of a short-circuit failure can be restricted.

In addition, in view of restriction of a failure caused by an external stress, it is preferable that a composite Young's modulus E expressed by the following formula be 5 GPa or more. It is further preferable that the above Young's modulus be 5 GPa or more and 15 GPa or less, from the viewpoint of the fact that the relative dielectric constant is sufficiently low.

$$E = \sum_{i=1}^{n} v_i E_i$$

where $V_i$ is a volume ratio of an i-th insulating material, and $E_i$ is a Young's modulus of the i-th insulating material. This volume ratio is obtained as a volume ratio of at least two types of insulating materials disposed between the upper face of the etching stopper insulating film 15 and the lower face of the upper layer wire 24.

Now, a process for manufacturing the semiconductor device shown in FIG. 1 will be described hereinafter. FIGS. 3A to 3E are sectional views each showing a process of manufacturing the semiconductor device according to the first embodiment of the present invention. In FIGS. 3A to 3E, the semiconductor substrate 10 is not shown.

First, as shown in FIG. 3A, the low dielectric constant interlayer insulating film 11 and the first cap insulating film 12 are sequentially laminated on a semiconductor substrate on which a semiconductor device or the like has been formed. The lower layer wiring grooves 13 are formed on the low dielectric constant interlayer insulating film 11 and the first cap insulating film 12. The lower layer wire 14 having a barrier metal layer is formed to be embedded in the lower layer wiring groove 13.

Figure 3B:
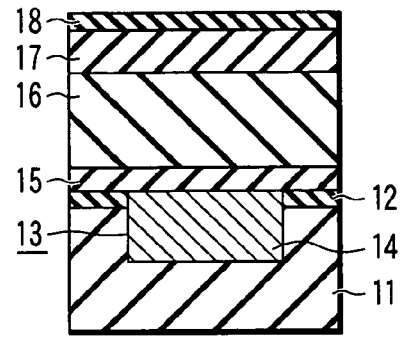

As shown in FIG. 3B, the silicon nitride layer 15 acting as an etching stopper insulating film is further formed by plasma CVD method. Next, the low linear expansivity insulating layer 16 is formed. Now, a method for forming the low linear expansivity insulating layer 16 will be specifically described here. A solution is prepared, the solution containing particles of an organic silicon oxide in a varnish (coating material for insulating film) obtained by dissolving polymethyl siloxane serving as a film material or its precursor in a solvent. The prepared solution is spin-coated onto the silicon nitride film 15 by using a coater. Next, this substrate is placed on a hot plate maintained at 80° C., and then, heat treatment is carried out for 1 minute. Then, this substrate is placed on a hot plate maintained at 200° C., and then, heat treatment is carried out for 1 minute. Lastly, a 30-minute heat treatment is carried out in a nitrogen atmosphere by using a hot plate maintained at 450° C.

Here, the Young's modulus of the low linear expansivity insulating layer 16 was measured by using a nanoindentation method. The measurement result was 8 GPa. In addition, a low linear expansivity insulating layer was formed on a silicon substrate by the above-described method, and a linear expansivity was measured by using a method for measuring a warping quantity of a substrate in accordance with a laser scanning method while changing a substrate temperature. The measurement result was $30 \times 10^{-6 \circ} C.^{-1}$ in the range from room temperature to 500° C.

Next, the low dielectric constant insulating film 17 is formed. A method for forming the low dielectric constant insulating film 17 will be described here. A vanish obtained by dissolving polymethyl siloxane serving as a film material or its precursor in a solvent is spin coated by using a coater. Next, this substrate is placed on a hot plate maintained at 80° C., and then, heat treatment is carried out for 1 minute. Then, this substrate is placed on a hot plate maintained at 200° C., and heat treatment is carried out for 1 minute. Lastly, 30-minute heat treatment is carried out in a nitrogen atmosphere by a hot plate maintained at 450° C.

On the thus formed low dielectric constant insulating film 17, the silicon oxide film 18 is formed in accordance with a plasma CVD method.

Figure 3C:
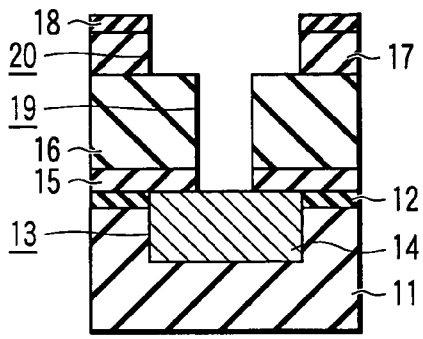

Next, as shown in FIG. 3C, the via holes 19 connected to the lower layer wire 14 are formed on the low linear expansivity insulating layer 16, the low dielectric constant insulating layer 17, and the silicon oxide film 18 by means of PIE processing. Further, in a region including the low dielectric constant insulating film 17 and the via hole 19 of the silicon oxide film 18, the upper layer wiring groove 20 is formed by means of RIE processing. Then, the silicon nitride film 15 at the bottom of the via hole 19 is removed by RIE, and the surface of the lower layer wire 14 is exposed.

Figure 3D:
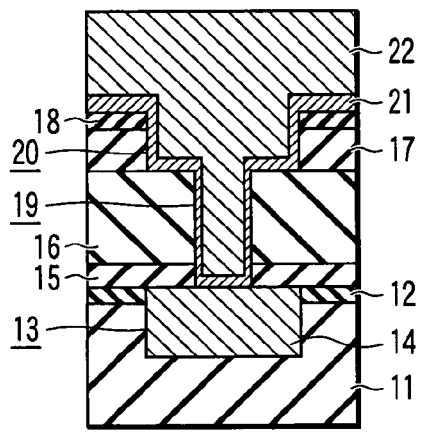

Next, as shown in FIG. 3D, a laminate film including any or two types or more of Ta, Ti, Nb, TaN, TiN, NbN, and WN is fully laminated at 150° C., and the barrier metal layer 21 is formed. Further, after Cu, which serves as a seed of plating, has been laminated, Cu serving as an electrically conducting material is laminated in accordance with a plating method, and the electrically conducting material 22 is embedded inside of the via hole 19 and upper layer wiring groove 20. Then, annealing is carried out. This annealing is carried out for about 1 hour in the case of an electric furnace and for about 1 to 5 minutes in the case of a hot plate in a foaming gas or in a nitride atmosphere by using the electric furnace or hot plate.

Figure 3E:
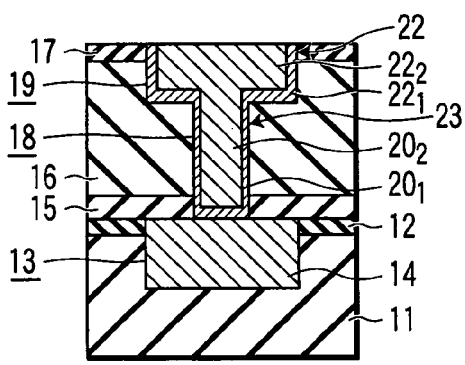

Lastly, as shown in FIG. 3E, the barrier metal layer 21 and electrically conducting material 22 laminated in a region other than the upper layer wiring groove 20 on the silicon oxide film 18 are removed in accordance with a CMP method. Then, using the plasma CVD method, a wiring structure shown in FIG. 1 is obtained by fully forming the silicon nitride film 25 at a substrate temperature of 380° C.

In the wiring structure shown in FIG. 1, the low linear expansivity insulating layer with a linear expansivity of $30 \times 10^{-6}$ C.$^{-1}$ or less is disposed at the periphery of a via plug with which a crack is prone to occur due to a thermal stress. Thus, a thermal stress acting on the barrier metal layer 21 on the side wall of the via hole is restricted. No crack occurred with the low linear expansivity insulating layer 16 at the periphery of the via hole 19 even through a high humidity process associated with annealing or film forming of a top insulating film, followed by a sintering process. By dispersing particles of an organic silicon oxide with its comparatively smaller linear expansivity, a linear expansivity can be lowered, and at the same time, a relative dielectric constant increased. However, in the above-described wiring structure, the general low dielectric constant insulating film 17 is disposed between wires which are the most effective to ensure a lowered dielectric constant, and thus, the advantageous effect of lowered dielectric constant is not degraded.

Second Embodiment

Figure 4:
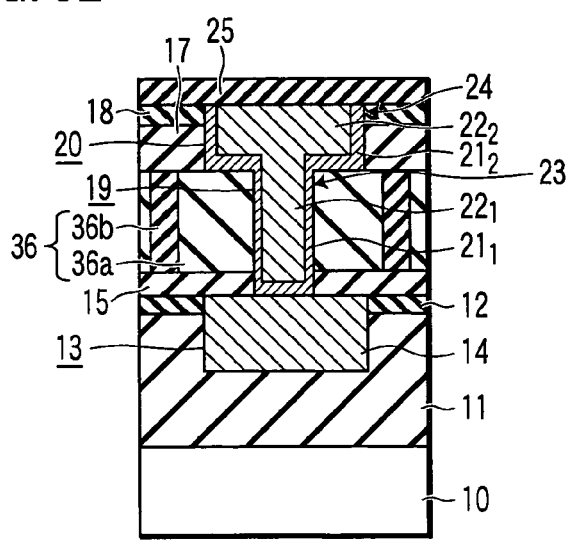
FIG. 4 is a sectional view showing a construction of a semiconductor device according to a second embodiment of the present invention.

FIG. 4 is a sectional view showing a construction of a semiconductor device according to a second embodiment of the present invention. Like elements similar to those of the semiconductor device shown in FIG. 1 are designated by like reference numerals. A description of these elements is omitted here.

As shown in FIG. 4, the semiconductor device comprises a low linear expansivity insulating layer 36 having embedded therein a second insulating material 30b having a linear expansivity of $30 \times 10^{-6}$ C.$^{-1}$ or less in a hole or a groove formed on a first insulating material 36a which is 3 or less in relative dielectric constant, which is 10 GPa or less in Young's modulus, and which is greater than $30 \times 10^{-6}$ C.$^{-1}$ in linear expansivity.

As the first insulating material 36a which is 3 or less in relative dielectric constant, which is 10 GPa or less in Young's modulus, and which is greater than $30 \times 10^{-6}$ C.$^{-1}$ in linear expansivity, for example, a polymethyl siloxane film can be used. Further, there may be used: an organic insulating material such as polyarylene and polyarylene polyether; hydrogen silsesquioxane; carbon-containing $SiO_2$ (SiOC); porous silica; a polymeric material; or amorphous carbon (F-doped). Any of these materials is 3 or less in relative dielectric constant, is 10 GPa or less in Young's modulus, and is greater than $30 \times 10^{-6}$ C.$^{-1}$ in linear expansivity. In addition, as the second insulating material 36b having a linear expansivity of $30 \times 10^{-6}$ C.$^{-1}$ or less, a silicon oxide or silicon nitride can be used. Further, there may be used: an organic silicon material formed in accordance with a CVD method, a fluorine-containing $SiO_2$ (SiOF), silicon oxynitride, or silicon carbonitride. Any of these materials is greater than 10 GPa in Young's modulus and about $0.1 \times 10^{-6}$ C.$^{-1}$ to $10 \times 10^{-6}$ C.$^{-1}$ in linear expansivity.

Figure 5:
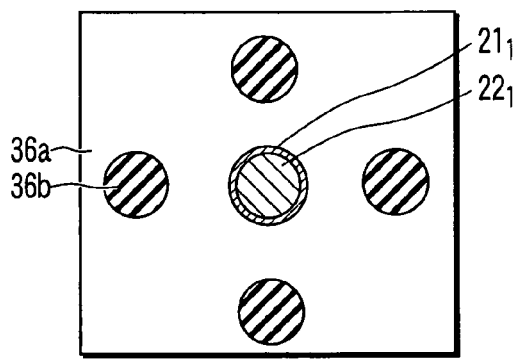
FIG. 5 is a view showing an arrangement and construction of a second insulating material for the semiconductor device shown in FIG. 4.
Figure 6:
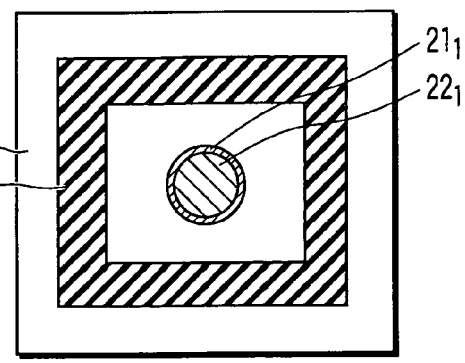
FIG. 6 is a view showing the arrangement and construction of the second insulating material for the semiconductor device shown in FIG. 4.

A method for disposing the second insulating material 36b is shown in FIGS. 5 and 6. FIGS. 5 and 6 are plan views each showing the semiconductor device according to the second embodiment of the present invention. The second insulating material 36b may be disposed in a columnar shape, as shown in FIG. 5 or may be disposed in a fence shape at the periphery of the via plug, as shown in FIG. 6.

Figure 7:
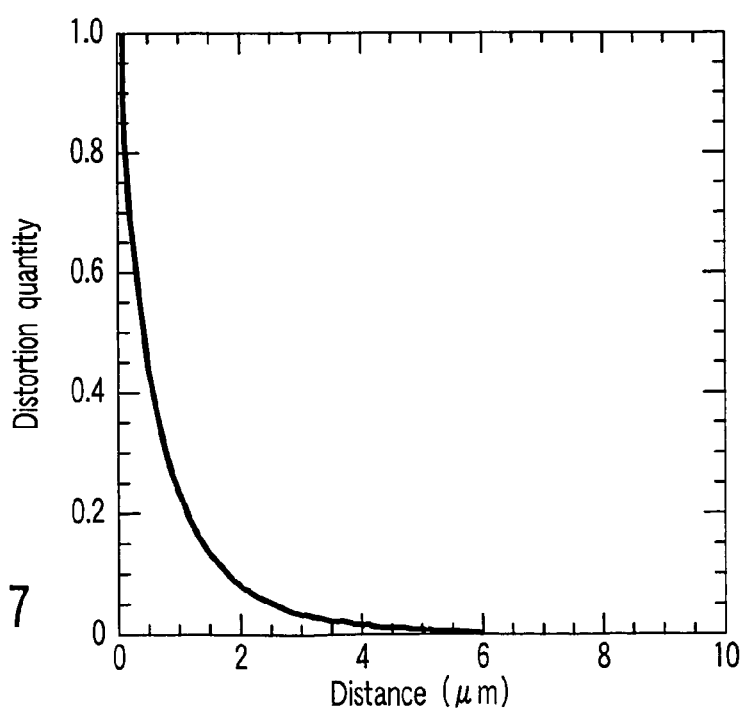
FIG. 7 is a view showing a distortion quantity of an insulating film in the vicinity of a via plug.

FIG. 7 shows a distortion quantity of an insulating film in the vicinity of a via plug at 300° C. in the case where a low dielectric constant insulating film which is $30 \times 10^{-6}$ C.$^{-1}$ in linear expansivity has been used at the periphery of the via plug. A dispersion at the side wall portion of the via plug is specified as 1. The distortion quantity of the insulating film decreases with a distance from the via plug. In particular, the distortion quantity rapidly decreases with a distance of 2 μm or more from the via plug, and the distortion quantity becomes almost zero with a distance of 6 μm or more. In the case where the second insulating material 36b of $30 \times 10^{-6}$ C.$^{-1}$ in linear expansivity is disposed in a columnar shape or in a fence shape, if disposition is made only within a distance of 6 μm from the via plug, both of advantageous effect of thermal stress restriction and advantageous effect of lowered dielectric constant increase. Further, if disposition is made only within a distance of 2 μm or less from the via plug, its advantageous effect increases more.

Figure 8:
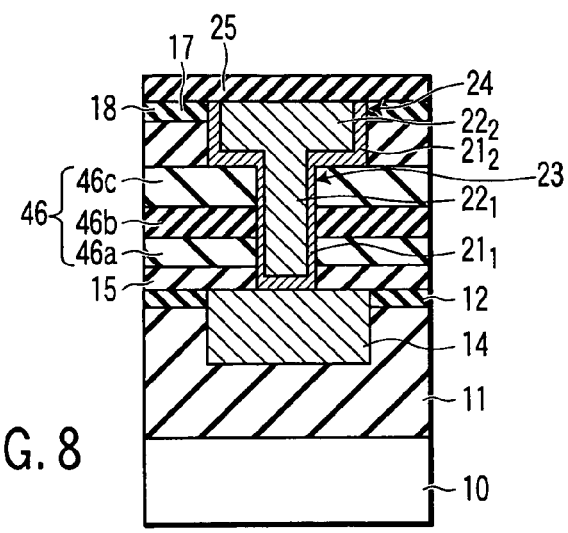
FIG. 8 is a view showing a construction of a semiconductor device according to a modified example of the second embodiment.

As shown in FIG. 8, a low linear expansivity insulating layer 46 may be composed of a laminated structure in which a second insulating film 46b is sandwiched by one layer between a first insulating film 46a and a third insulating film 46c. The first and third insulating films 46a, 46c are 3 or less in relative dielectric constant, is 10 GPa or less in Young's modulus, and is greater than $30 \times 10^{-6}$ C.$^{-1}$ in linear expansivity. The second insulating film 46b is $30 \times 10^{-6}$ C.$^{-1}$ or less in linear expansivity. FIG. 8 is a view showing a construction of a semiconductor device according to a modified example of the second embodiment of the present invention.

As the first insulating film 46a and the third insulating film 46c which are 3 or less in relative dielectric constant, which are 10 GPa or less in Young's modulus, and which are greater than $30 \times 10^{-6}$ C.$^{-1}$ in linear expansivity, for example, a polymethyl siloxane film can be used. Further, there may be used: an organic insulating material such as polyarylene and polyarylene polyether; hydrogen silsesquioxane; carbon-containing $SiO_2$ (SiOC); porous silica; a polymeric material; or amorphous-carbon (F-doped). Any of these materials is 3 or less in relative dielectric constant, is 10 GPa or less in Young's modulus, and is greater than $30 \times 10^{-6}$ C.$^{-1}$ in linear expansivity. In addition, as the second insulating material 46b having its linear expansivity of $30 \times 10^{-6}$ C.$^{-1}$ or less, a silicon oxide or silicon nitride can be used. Further, there may be used: an organic silicon material formed in accordance with a CVD method; a fluorine-containing $SiO_2$ (SiOF); silicon oxynitride; or silicon carbonitride. Any of these materials is greater than 10 GPa in Young's modulus and about $0.1 \times 10^{-6}$ C.$^{-1}$ to $10 \times 10^{-6}$ C.$^{-1}$ in linear expansivity.

Figure 9A:
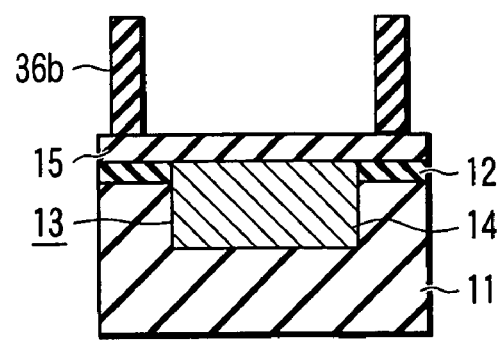
FIGS. 9A to 9C are sectional views each showing a process for manufacturing the semiconductor device according to the second embodiment.
Figure 9B:
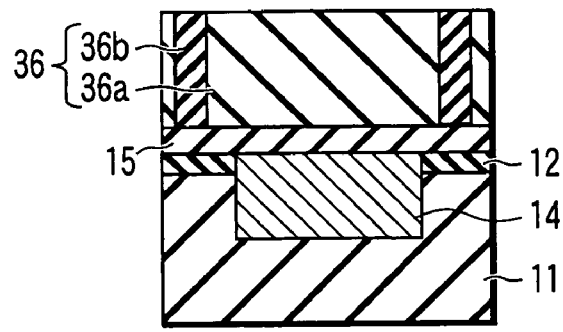
Figure 9C:
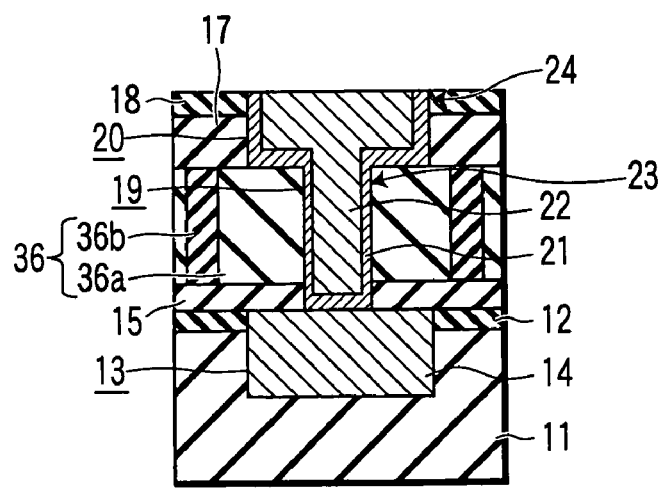

Next, a method for forming the structure shown in FIGS. 5 and 6 will be described in order of the steps. FIGS. 9A to 9C are sectional views each showing a process for manufacturing the semiconductor device according to the second embodiment of the present invention. In FIGS. 9A to 9C, the semiconductor substrate 10 is not shown.

First, the lower layer wires 14 embedded in the low dielectric constant interlayer insulating film 11 and the first cap insulating film 12 and the silicon nitride film 15 acting as an etching stopper insulating film are sequentially formed in the same manner as in the first embodiment described previously.

Next, a silicon oxide film (linear expansivity=$0.7 \times 10^{-6}$ C.$^{-1}$) is fully formed by using a plasma CVD method. A pattern is formed on the silicon oxide film by using a photoresist. With this pattern being as a mask, the silicon oxide film 36b is formed in a columnar (or fence) shape by means of RIE processing (FIG. 9A).

Next, a varnish obtained by dissolving polymethyl siloxane serving as a film material or its precursor in a solvent is spin coated by using a coater so as to be embedded between the columnar silicon oxide films 36b. Subsequently, this substrate is placed on a hot plate maintained at 80° C., and then, heat treatment is carried out for 1 minute. Then, this substrate is placed on a hot plate maintained at 200° C., and then, heat treatment is carried out for 1 minute. Lastly, 30-minute heat treatment is carried out in a nitride atmosphere by a hot plate maintained at 450° C. Then, the polymethyl siloxane film 36a is formed by flattening it (FIG. 9B). The linear expansivity of the thus formed polymethyl siloxane film 36a was $40 \times 10^{-6\circ}$ $C.^{-1}$. In the present embodiment, the columnar silicon oxide film 36b is disposed at a position within 2 μm from a region in which a via plug is to be formed. A volume ratio between the polymethyl siloxane film 36a and the silicon oxide film 36b disposed in a columnar shape was 7:3 within 6 μm from a region in which a via plug is to be formed. From the above formula, the composite linear expansivity of the low linear expansivity insulating film 36 in the present embodiment is $28 \times 10^{-6\circ}$ $C.^{-1}$.

Next, the low dielectric constant insulating film 17 and the silicon oxide film 18 are formed in the same manner as in the first embodiment described previously. Further, the via hole 19 and the upper layer wiring groove 20 are formed by means RIE processing. The barrier metal layer 21 and the electrically conducting materials 22, each of which comprises Cu, are embedded in the via hole 19 and the upper layer wiring groove 20 (FIG. 9C). Lastly, the silicon nitride film 25 is fully formed, thereby making it possible to obtain a semiconductor device having a structure shown in FIGS. 5 and 6.

In the case where the wiring structure shown in FIG. 8 is formed, the first insulating film 46a, the second insulating film 46b, and the third insulating film 46c are sequentially formed on the silicon nitride film 15.

In the semiconductor device having the thus formed wiring structure, a low linear expansivity insulating layer of $30 \times 10^{-6\circ}$ $C.^{-1}$ in composite linear expansivity is disposed at the periphery of the via hole on which a crack is prone to occur due to a thermal stress. Thus, a thermal stress acting on the barrier metal layer is restricted. No crack occurred with the low linear expansivity insulating layer at the periphery of the via hole even through a high humidity process associated with annealing or film forming of a top insulating film, followed by a sintering process. By producing a composite material with a silicon oxide film with its linear expansivity, a linear expansivity can be lowered, and at the same time, a relative dielectric constant increases. However, in the above-described wiring structure, a general low dielectric constant insulating film is disposed between wires which are the most effective to ensure a lowered dielectric constant, and thus, advantageous effect of the lowered dielectric constant is not degraded. Further, in the structure shown in FIGS. 4, 5, and 6, a silicon oxide film with its high relative dielectric constant is disposed in place which is distant from a via plug and a wiring edge. In addition, in the structure shown in FIG. 8 as well, a silicon oxide film with its high relative dielectric constant is disposed in place which is distant from a wiring edge, and thus, advantageous effect of the lowered dielectric constant can be improved.

The present invention is not limited to the above-described embodiments. For example, although the low expansion insulating layer has been composed of two types of insulating materials in the first and second embodiments, this insulating layer may be composed of three types or more of insulating materials without being limited to such two types.

Furthermore, an insulating layer having a composite linear expansivity α of $30 \times 10^{-6\circ}$ $C.^{-1}$ or less has been specified with an etching stopper insulating film being omitted. In the case of a material its low dielectric constant has been used, such an etching stopper insulating film may not be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
   a semiconductor substrate;
   a first insulating layer formed above the semiconductor substrate, and comprising a first insulating material, a second insulating material, a first hole,
   a first insulating film which comprises a second hole or groove disposed to be distant from the first hole, and a second insulating film formed in the second hole or groove;
   a second insulating layer formed on the first insulating layer, the second insulating layer having a groove connected to the first hole;
   a barrier metal layer formed on a surface of the first hole and the groove; and
   an electrically conducting layer comprising Cu formed on the barrier metal layer,
   wherein a composite linear expansivity α is expressed by the following formula:

$$\alpha = \sum_{i=1}^{n} v_i \alpha_i$$

where $v_i$ is a volume ratio of an i-th insulating material, and $\alpha_i$ is a linear expansivity of the i-th insulating material, and the composite linear expansivity α of the first insulating layer within 6 μm from the first hole is $30 \times 10^{-6}$ °$C.^{-1}$ or less,
   wherein a relative dielectric constant of the first insulating material is 3 or less, a Young's modulus of the first insulating material being 10 GPa or less, a linear expansivity of the first insulating material is greater than $30 \times 10^{-6}$ °$C.^{-1}$ and a linear expansivity of the second insulating material is $30 \times 10^{-6}$ °$C.^{-1}$ or less, and
   wherein the relative dielectric constant of the first insulating film is 3 or less, the Young's modulus of the first insulating film is 10 GPa or less, the linear expansivity of the first insulating film is greater than $30 \times 10^{-6}$ °$C.^{-1}$, and the linear expansivity of the second insulating film is $30 \times 10^{-6}$ °$C.^{-1}$ or less.

2. A semiconductor device according to claim 1, wherein the composite linear expansivity a of the first insulating layer within 2 μm from the first hole is $30 \times 10^{-6}$ °$C.^{-1}$ or less.

3. A semiconductor device according to claim 1, wherein a composite Young's modulus E is expressed by the following formula:

$$E = \sum_{i=1} v_i E_i$$

where $v_i$ is a volume ratio of an i-th insulating material, and $E_i$ is a Young's modulus of the i-th insulating material, and a composite Young's modulus E of the first insulating layer is 5 GPa or more.

4. A semiconductor device according to claim 3, wherein the composite Young's modulus of the first insulating layer is 5 GPa or more and 15 GPa or less.

5. A semiconductor device according to claim 1, wherein the barrier metal layer includes one or more materials selected from the group consisting of Ta, Ti, W, and Nb.

6. A semiconductor device according to claim 1, wherein the relative dielectric constant of the second insulating layer is 3 or less.

7. A semiconductor device according to claim 1, wherein the first insulating film is selected from the group consisting of a polymethyl siloxane film, an organic insulating film, a hydrogen silsesquioxane film, a carbon-containing silicon oxide film, porous silica film, a polymeric film, and F-doped amorphous carbon film.

8. A semiconductor device according to claim 1, wherein the second insulating film is selected from the group consisting of a silicon oxide film, a silicon nitride film, an organic silicon film, a fluorine-containing silicon oxide film, a silicon oxynitride film, and a silicon carbonitride film.

9. A semiconductor device comprising:
a semiconductor substrate;
a first insulating layer formed above the semiconductor substrate, and comprising a first insulating material, a second insulating material and a first hole, the first insulating layer having a laminated structure with at least a first insulating film and a second insulating film;
a second insulating layer formed on the first insulating layer, the second insulating layer having a groove connected to the first hole;
a barrier metal layer formed on a surface of the first hole and the groove; and
an electrically conducting layer comprising Cu formed on the barrier metal layer,
wherein a composite linear expansivity a is expressed by the following formula:

$$\alpha = \sum_{i=1} v_i \alpha_i$$

where $v_i$ is a volume ratio of an i-th insulating material, and $\alpha_i$ is a linear expansivity of the i-th insulating material, and the composite linear expansivity α of the first insulating layer within 6 μm from the first hole is $30 \times 10^{-6}$ °C.$^{-1}$ or less, and
wherein a relative dielectric constant of the first insulating material is 3 or less, a Young's modulus of the first insulating material is 10 GPa or less, a linear expansivity of the first insulating material being greater than $30 \times 10^{-6}$ °C.$^{-1}$ and a linear expansivity of the second insulating material is $30 \times 10^{-6}$ °C.$^{-1}$ or less, and wherein the relative dielectric constant of the first insulating film is 3 or less, the Young's modulus of the first insulating film is 10 GPa or less, the linear expansivity of the first insulating film is greater than $30 \times 10^{-6}$ °C.$^{-1}$ and the linear expansivity of the second insulating film is $30 \times 10^{-6}$ °C.$^{-1}$ or less.

10. A semiconductor device according to claim 9, wherein the first insulating layer comprises: the first insulating film; the second insulating film formed on the first insulating film; and a third insulating film formed on the second insulating film, and
the relative dielectric constant of the third insulating film is 3 or less, the Young modulus of the third insulating film is 10 GPa or less, and the linear expansivity of the third insulating film is greater than $30 \times 10^{-6}$ °C.$^{-1}$.

11. A semiconductor device according to claim 9, wherein the first insulating film is selected from the group consisting of a polymethyl siloxane film, an organic insulating film, a hydrogen silsesquioxane film, a carbon-containing $SiO_2$ film, porous silica film, a polymeric film, and F-doped amorphous carbon film.

12. A semiconductor device according to claim 9, wherein the second insulating film is selected from the group consisting of a silicon oxide film, a silicon nitride film, an organic silicon film, a fluorine-containing silicon oxide film, a silicon oxynitride film, and a silicon carbonitride film.

13. A semiconductor device according to claim 9, wherein the composite linear expansivity a of the first insulating layer within 2 μm from the first hole is $30 \times 10^{-6}$ °C.$^{-1}$ or less.

14. A semiconductor device according to claim 9, wherein a composite Young's modulus E is expressed by the following formula:

$$E = \sum_{i=1} v_i E_i$$

where $V_i$ is a volume ratio of an i-th insulating material, and $E_i$ is a Young's modulus of the i-th insulating material, and a composite Young's modulus E of the first insulating layer is 5 GPa or more.

15. A semiconductor device according to claim 14, wherein the composite Young's modulus of the first insulating layer is 5 GPa or more and 15 GPa or less.

16. A semiconductor device according to claim 9, wherein the barrier metal layer includes one or more materials selected from the group consisting of Ta, Ti, W, and Nb.

17. A semiconductor device according to claim 9, wherein the relative dielectric constant of the second insulating layer is 3 or less.

18. A semiconductor device comprising:
a semiconductor substrate;
an insulating layer formed above the semiconductor substrate, and having at least one of a hole and a groove;
a barrier metal layer formed on a surface of at least one of the hole and groove; and
an electrically conducting layer comprising Cu formed on the barrier metal layer,
wherein at least a part of the insulating layer is formed of a composite film having dispersed in an insulating film with a relative dielectric constant of 3 or less, insulating particles whose linear expansivity is smaller than that of the insulating film.

19. A semiconductor device according to claim 18, wherein the linear expansivity of the insulating film is greater than $30\times10^{-6}$ °C.$^{-1}$ and the linear expansivity of the insulating particles is $30\times10^{-6}$ °C.$^{-1}$ or less.

20. A semiconductor device according to claim 18, wherein the composite film is formed at least at the periphery of a via plug which comprises the barrier metal layer and the electrically conducting layer.

21. A semiconductor device according to claim 18, wherein the insulating layer includes a first insulating layer and a second insulating layer;
the first insulating layer being formed above the semiconductor substrate, and comprising a first insulating material, a second insulating material and a first hole, a relative dielectric constant of the first insulating material being 3 or less, a Young's modulus of the first insulating material being 10 GPa or less, a linear expansivity of the first insulating material being greater than $30\times10^{-6}$ °C.$^{-1}$ and a linear expansivity of the second insulating material being $30\times10^{-6}$ °C.$^{-1}$ or less;
the second insulating layer being formed on the first insulating layer, the second insulating layer having a groove connected to the first hole; and
the barrier metal layer is formed on a surface of the first hole and the groove; and
wherein a composite linear expansivity a is expressed by the following formula:

$$\alpha = \sum_{i=1}^{} v_i \alpha_i$$

where $v_i$ is a volume ratio of an i-th insulating material, and $\alpha_i$ is a linear expansivity of the i-th insulating material, and
the composite linear expansivity a of the first insulating layer within 6 μm from the first hole is $30\times10^{-6}$ °C.$^{-1}$ or less.

22. A semiconductor device according to claim 21, wherein the first insulating layer comprises the insulating film and the insulating particles dispersed in the insulating film, and
the relative dielectric constant of the insulating film is 3 or less, the Young's modulus of the insulating film is 10 GPa or less, the linear expansivity of the insulating film is greater than $30\times10^{-6}$ °C.$^{-1}$, and the linear expansivity of the insulating particles is $30\times10^{-6}$ °C.$^{-1}$ or less.

23. A semiconductor device according to claim 22, wherein the insulating film is selected from the group consisting of polymethyl siloxane, an organic insulating material, hydrogen silsesquioxane, carbon-containing silicon oxide, porous silica, polymeric material, and F-doped amorphous carbon.

24. A semiconductor device according to claim 22, wherein the insulating particles are one or more selected from the group consisting of organic silicon oxide; carbon-containing silicon oxide, and fluorine-containing silicon oxide.

25. A semiconductor device according to claim 22, wherein the insulating particles are dispersed by 20 to 30 volume % with respect to the insulating film.

26. A semiconductor device according to claim 21, wherein the composite linear expansivity a of the first insulating layer within 2 μm from the first hole is $30\times10^{-6}$ °C.$^{-1}$ or less.

27. A semiconductor device according to claim 21, wherein a composite Young's modulus E is expressed by the following formula:

$$E = \sum_{i=1}^{} v_i E_i$$

where $V_i$ is a volume ratio of an i-th insulating material, and $E_i$ is a Young's modulus of the i-th insulating material, and a composite Young's modulus E of the first insulating layer is 5 GPa or more.

28. A semiconductor device according to claim 27, wherein the composite Young's modulus of the first insulating layer is 5 GPa or more and 15 GPa or less.

29. A semiconductor device according to claim 18, wherein the barrier metal layer includes one or more materials selected from the group consisting of Ta, Ti, W, and Nb.

30. A semiconductor device according to claim 21, wherein the relative dielectric constant of the second insulating layer is 3 or less.

* * * * *

UNITED STATES PATENT AND TRADEMARK OFFICE
CERTIFICATE OF CORRECTION

PATENT NO. : 7,119,442 B2
APPLICATION NO. : 10/986071
DATED : October 10, 2006
INVENTOR(S) : Ito et al.

It is certified that error appears in the above-identified patent and that said Letters Patent is hereby corrected as shown below:

Title page, item (57), lines 7-8, change "$30 \times 10^{-6\circ}$ C.$^{-1}$," to --$30 \times 10^{-6}$ °C.$^{-1}$,--.

Title page, item (57), line 9, change "$30 \times 10^{-6\circ}$ C.$^{-1}$," to --$30 \times 10^{-6}$ °C.$^{-1}$--.

Title page, item (57), line 13, change "$30 \times 10^{-6\circ}$ C.$^{-1}$," to --$30 \times 10^{-6}$ °C.$^{-1}$--.

Claim 1, column 10, line 25, change "device comprising:" to --device, comprising:--.

Claim 1, column 10, line 57, change "$30 \times 10^{-6}$ °C.$^{-1}$ and" to --$30 \times 10^{-6}$ °C.$^{-1}$, and--.

Claim 2, column 10, line 66, change "expansivity a" to --expansivity $\alpha$--.

Claim 9, column 11, line 34, change "device comprising:" to --device, comprising:--.

Claim 9, column 11, line 49, change "expansivity a" to --expansivity $\alpha$--.

Claim 9, column 11, line 66, change "$30 \times 10^{-6}$ °C.$^{-1}$ and" to --$30 \times 10^{-6}$ °C.$^{-1}$, and--.

Claim 9, column 12, lines 4-5, change "$30 \times 10^{-6}$ °C.$^{-1}$ and" to --$30 \times 10^{-6}$ °C.$^{-1}$, and--.

* Claim 10, column 12, line 13, change "Young" to --Young's--.

Claim 13, column 12, line 28, change "expansivity a" to --expansivity $\alpha$--.

Claim 14, column 12, line 39, change "$V_i$" to --$v_i$--.

Claim 19, column 13, line 1, change "$30 \times 10^{-6}$ °C.$^{-1}$ and" to --$30 \times 10^{-6}$ °C.$^{-1}$, and--.

Claim 21, column 13, line 17, change "$30 \times 10^{-6}$ °C.$^{-1}$ and" to --$30 \times 10^{-6}$ °C.$^{-1}$, and--.

Claim 21, column 13, line 24, change "expansivity a" to --expansivity $\alpha$--.

Claim 21, column 13, line 35, change "expansivity a" to --expansivity $\alpha$--.

Claim 26, column 14, line 18, change "expansivity a" to --expansivity $\alpha$--.

UNITED STATES PATENT AND TRADEMARK OFFICE
CERTIFICATE OF CORRECTION

PATENT NO. : 7,119,442 B2
APPLICATION NO. : 10/986071
DATED : October 10, 2006
INVENTOR(S) : Ito et al.

It is certified that error appears in the above-identified patent and that said Letters Patent is hereby corrected as shown below:

Claim 27, column 14, line 30, change "$V_i$" to --$v_i$--.

Signed and Sealed this

Sixteenth Day of January, 2007

JON W. DUDAS
*Director of the United States Patent and Trademark Office*

UNITED STATES PATENT AND TRADEMARK OFFICE
CERTIFICATE OF CORRECTION

PATENT NO.         : 7,119,442 B2  
APPLICATION NO. : 10/986071  
DATED                 : October 10, 2006  
INVENTOR(S)        : Sachiyo Ito et al.

Page 1 of 1

It is certified that error appears in the above-identified patent and that said Letters Patent is hereby corrected as shown below:

Title page, item [73] Assignee: should be -- Kabushiki Kaisha Toshiba --

Signed and Sealed this

Twenty-fourth Day of April, 2007

JON W. DUDAS  
*Director of the United States Patent and Trademark Office*